United States Patent [19]

Shinano et al.

[11] Patent Number: 4,745,679
[45] Date of Patent: May 24, 1988

[54] AUTOMATIC INSERTION MACHINE FOR ELECTRONIC COMPONENTS

[75] Inventors: Keizo Shinano, Kodaira; Shinichi Ishizuka, Shinjuku; Yoshinobu Inoue, Hachioji, all of Japan

[73] Assignee: Citizen Watch Co., Ltd., Tokyo, Japan

[21] Appl. No.: 858,443

[22] PCT Filed: Sep. 9, 1985

[86] PCT No.: PCT/JP85/00504
§ 371 Date: Apr. 24, 1986
§ 102(e) Date: Apr. 24, 1986

[87] PCT Pub. No.: WO86/01971
PCT Pub. Date: Mar. 27, 1986

[30] Foreign Application Priority Data

Sep. 12, 1984 [JP] Japan ............................ 59-189744
Sep. 12, 1984 [JP] Japan ............................ 59-137206[U]
Sep. 13, 1984 [JP] Japan ............................ 59-139012[U]

[51] Int. Cl.⁴ ............................................. B23P 19/04
[52] U.S. Cl. ........................................ 29/741; 29/838
[58] Field of Search ................... 29/739, 741, 837–839, 29/785, 792, 33 M, 564.2, 564.6

[56] References Cited

U.S. PATENT DOCUMENTS

4,063,347 12/1977 Woodman, Jr. ...................... 29/741
4,313,251 2/1982 Asai et al. ............................ 29/739

Primary Examiner—P. W. Echols
Attorney, Agent, or Firm—Koda and Androlia

[57] ABSTRACT

In an automatic electronic component insertion machine for inserting electronic components into the inserting holes in a printed-circuit board, inserting operations for any shaped electronic components among taped axial electronic components, taped radial components and stick-packed electronic components can be conducted with a single electronic components insertion machine. Especially, in the machine, insertion spindles are mounted in a turret form to perform the inserting operations at the single fixed position.

11 Claims, 10 Drawing Sheets

AUTOMATIC INSERTION MACHINE FOR ELECTRONIC COMPONENTS

TECHNICAL FIELD

This invention relates to an automatic insertion machine for electronic components, in which many types of taped electronic components, that is, taped axial lead components and taped radial lead components, and stick-packed ICs are held respectively and fed selectively to a carried-in printed-circuit board in a predetermined sequence, and the leads of the electronic components are inserted in the appropriate holes in the printed-circuit board.

BACKGROUND TECHNOLOGIES

In the conventional automatic insertion machine for electronic components of this type, a plurality of insertion spindles, which correspond to the shapes and sizes of electronic componenets supplied selectively in a predetermined sequence, insert the leads of electronic components in their lead inserting holes in the respective different inserting positions. It is, therefore, necessary that the carried-in printed-circuit board should be moved so that each predetermined lead inserting hole in the printed-circuit board may align to one of the aforementioned respective different insertion spindle positions. As a result, the range of movement of a printed-circuit board traverse device becomes too wide to make it for practical use. Thus the conventional machine has a defeat that the traverse device is large-sized.

This invention is intended to reduce the size of a printed-circuit board traverse device and improve the efficiency of an inserting operation for inserting the leads of many types of electronic components by selectively indexing the insertion spindle suitable for each electronic component supplied selectively and by inserting the leads of the electronic component into the inserting-holes in the printed-circuit board at a single fixed position.

DISCLOSURE OF THE INVENTION

The subject matter of the present invention lies in the construction of an automatic insertion machine for electronic components comprising:

a printed-circuit board traverse device for supporting a printed-circuit board and traversing it so that an inserting hole in the printed-circuit board for inserting a lead of an electronic component is placed in a single fixed position;

an insertion spindle column which is located above the traverse device, comprising a plurality of insertion spindles each having a different insertion chuck, and indexes one of the plurality of insertion spindles which is corresponding to a selected electronic component to the single fixed position;

a taped component holding and feeding device having a plurality of taped electronic component feeders arranged for holding many taped electronic components and feeding them sequentially to the insertion spindles, one of the taped component feeders being optionally selected and indexed to the vicinity of the single fixed position, the taped component holding and feeding device feeding the optionally selected electronic component to the insertion spindle indexed to the single fixed position; and a stick-packed component holding and feeding device for taking out an electronic component in a stick selected optionally, from a stick holding rack in which many electronic components in the sticks are held, and carrying out and supplying the electronic component to the insertion spindle indexed to the single fixed position.

The printed-circuit board traverse device moves the printed-circuit board for inserting the leads of electronic components into the holes in the printed-circuit board at the single fixed position and stops them sequentially. The insertion spindle column supports a plurality of insertion spindles and indexes the insertion spindle which is suitable for the taped electronic component being inserted or for the electronic component selectively supplied from the stick. If the electronic component being inserted is a taped component, it is fed to the insertion spindle when the appropriate taped electronic component feeder is indexed to the predetermined position near the single fixed position. The appropriate taped electronic component feeder has been selected from many taped electronic component feeders lined in the left and right direction in the taped component holding and feeding device. The taped component holding and feeding device can be moved in the left and right direction relative to the single fixed position.

On the other hand, if the electronic component being inserted is an electronic component held in a stick, a desired electronic component is selectively fed from the stick component holding and feeding device and fed to another indexed insertion spindle suitable for that electronic component.

The above-mentioned inserting operation is performed by moving sequentially all the electronic component inserting positions of the printed-circuit board to the single fixed position. Therefore, without reciprocating the printed-circuit board, the predetermined electronic components can be inserted sequentially from one end of the board.

BRIEF DESCRIPTION OF THE DRAWINGS

The accompanying drawings show one embodiment of the present invention, in which

FIG. 7 shows a taped radial component feeder in which FIG. 7 (A) is a side view and FIG. 7 (B) is a plan view of the main portion;

FIG. 11 shows an intermediate feeding device in which FIG. 11 (A) is a side view and FIG. 11 (B) is a detail view illustrating the shape of a cam plate.

Figure 1:
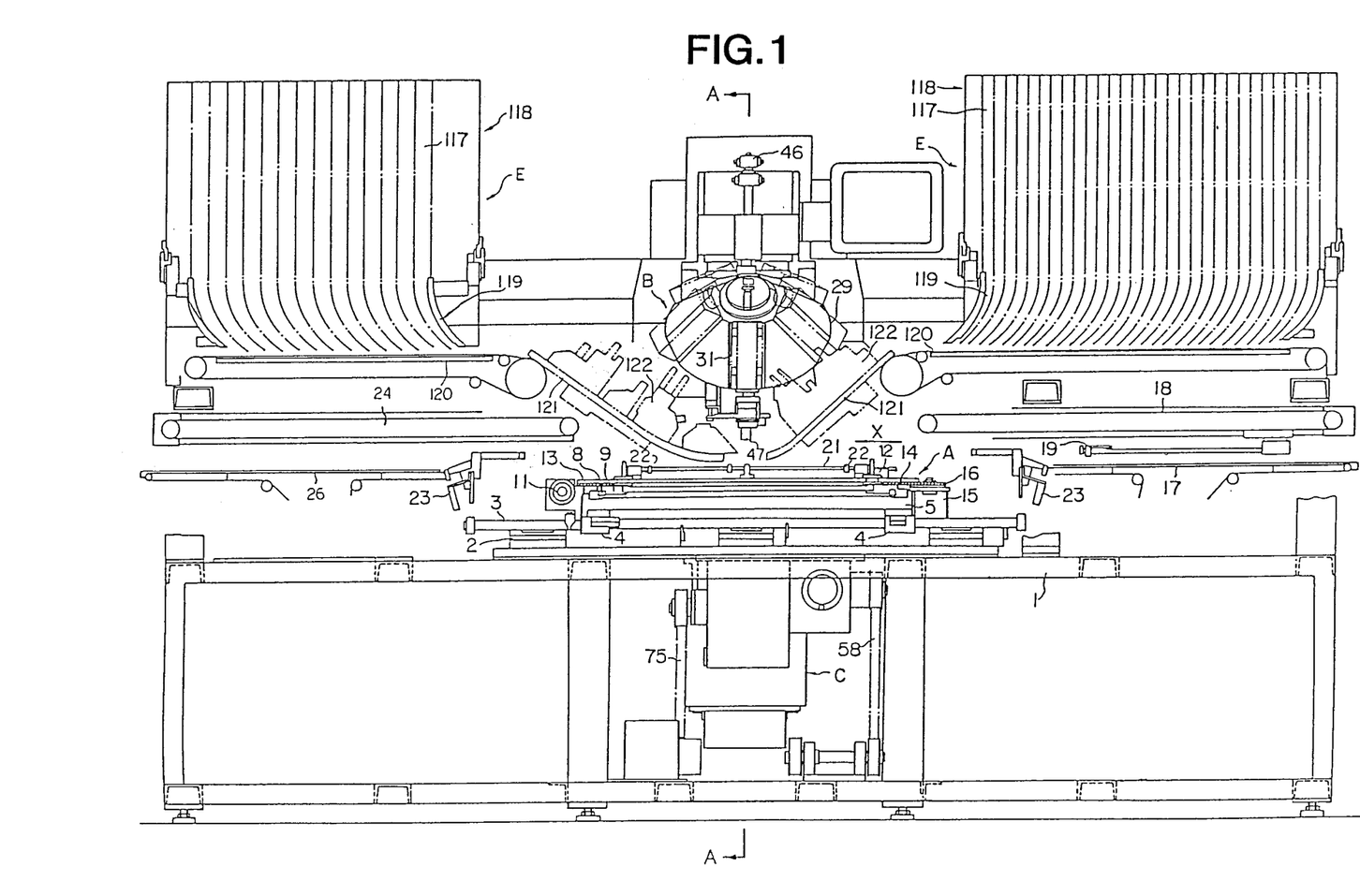
FIG. 1 is a front view.
Figure 2:
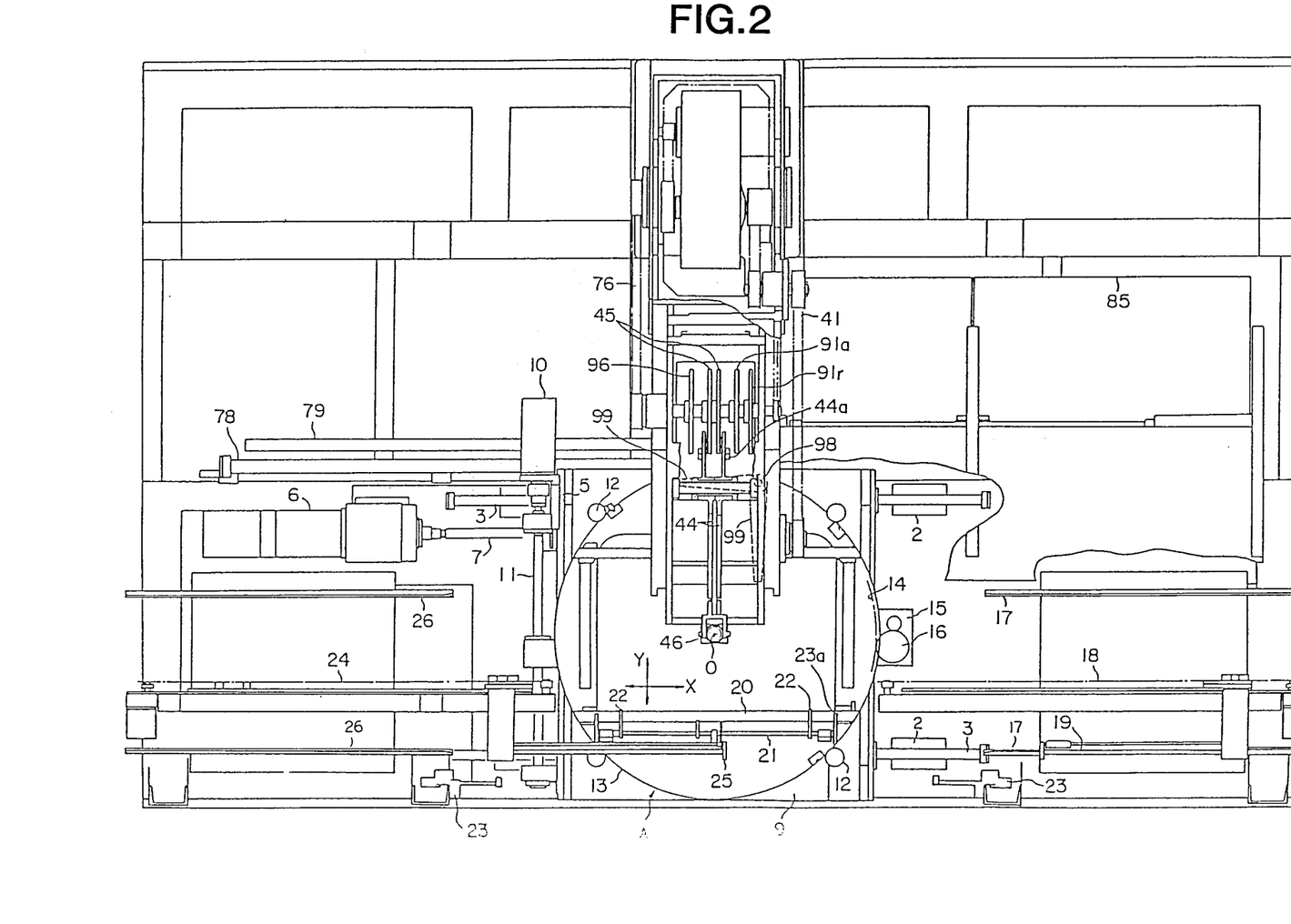
FIG. 2 is a partially cutaway plan view.
Figure 3:
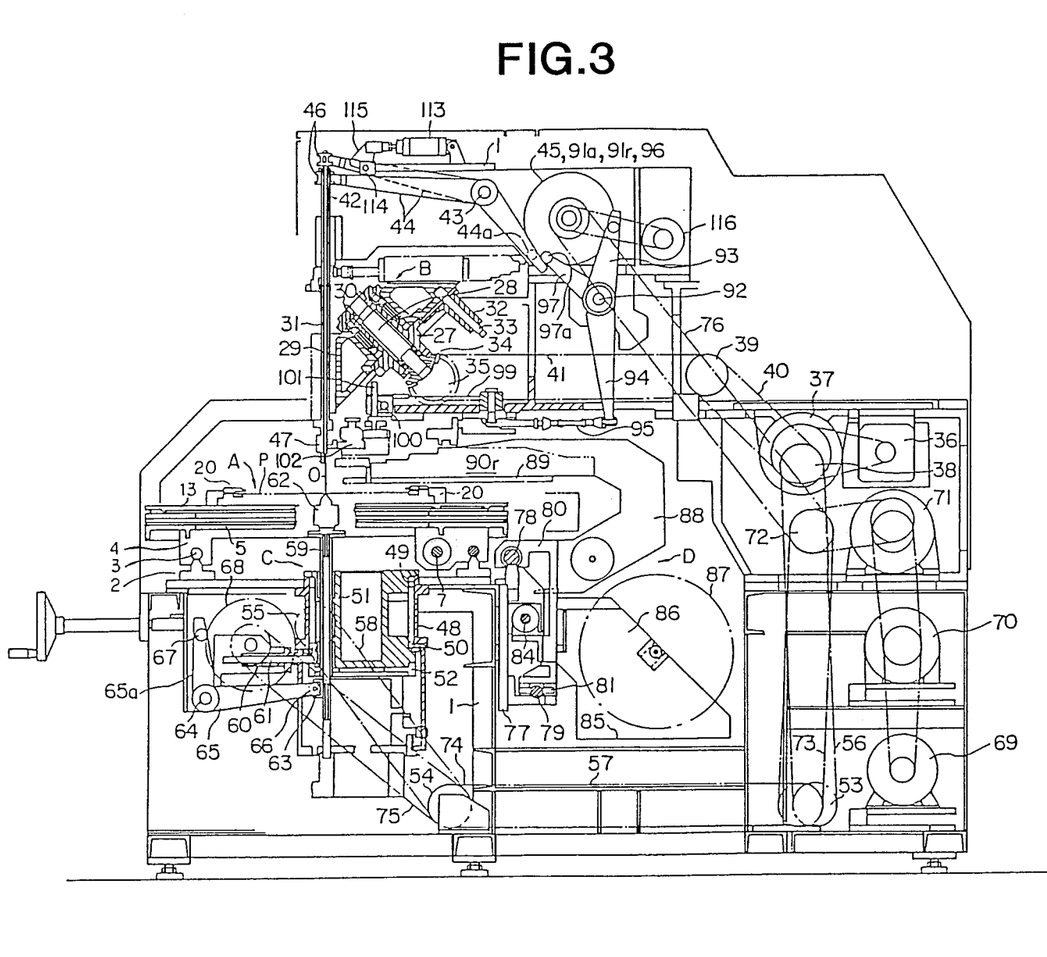
FIG. 3 is a sectional view taken along the arrows A—A of FIG. 1.

BEST MODE FOR CARRYING OUT THE INVENTION (1) Printed-Circuit Board Traverse Device A As shown in FIGS. 1 to 3, in a printed-circuit board traverse device A (XYΘ) table), on supports 2 fixed to a base frame 1, are secured a pair of guide rods 3 each having a circular section and extending in the right and left direction of FIG. 1 (the X direction). The XYΘ table is also provided with an X frame 5 having guide rod holders 4 which slide while holding the guide rods 3. The X frame 5 is reciprocated in the X direction along the guide rods 3 by a feed screw 7 to be turned by a motor 6 mounted on the base frame 1.

On both the right and left sides of the upper surface of the X frame 5 are secured guideways 8 extending in the Y direction perpendicular to the X direction, and along the guideways 8, a Y frame 9 which is guidedly moved in the Y direction is reciprocated by a feed screw 11 to be turned by a motor 10 attached to the X frame 5.

At four corners on the Y frame 9, grooved guide rollers 12 are rotatably journalled. The periphery of a round table 13 is fit into the grooves in the rollers 12 and is guidedly supported. A concentric gear 14 of a large diameter provided under the table 13 is meshed with a pinion 16 rotated by a motor 15 attached to the Y frame 9. Thus the table 13 is rotated on its center axis (Θ axis) from the reference position to the desired angle, e.g. 90°, 180° and 270°.

Motors 6, 10 and 15 are numerically controlled according to a predetermined program. In this embodiment, the motors 6 and 10 are DC servo motors and the motor 15 is a pulse motor.

Printed-circuit board P is carried from a magazine (not shown) along a conveyor 17 provided on one side of the base frame 1 and having a guide rail.

Then, when the round table 13 is at the reference position (0°) and the X frame 5 is shifted at the right most position, the printed-circuit board P is guidedly fed into a printed-circuit board mounting frame 20 secured in the X direction on the round table 13 by the push rod 19 fed by the feed driving chain 18 in FIG. 1. To a rod 21 journalled in the feed direction on the round table 13, a pair of levers 22 are secured, and by fitting an engaging pin at each point of levers 22 into each of locating holes provided in the printed-circuit board P, the printed-circuit board P is located on the XYΘ table A. The engaging pin inserted in the locating hole is released by engaging a layer 23a secured to the rod 21 with one of releasing means 23 at the right or left traversed ends of the X frame 5 and turning the rod.

The printed-circuit board P on the XYΘ table A is taken out by a drawing hook 25 which is moved by a drawing driving chain 24 provided on the other side of the base frame 1, and then the board P is carried along a conveyor 26. The drawing hook 25 is fixed to the end of a long rod similar to the push rod 19 and is engaged with the edge of the printed-circuit board P on the side the board P is pushed in, at the leftmost traversed position of the X frame 5. Then, the drawing hook 25 draws out the board P.

(2) Insertion Spindle Column B

Figure 9:
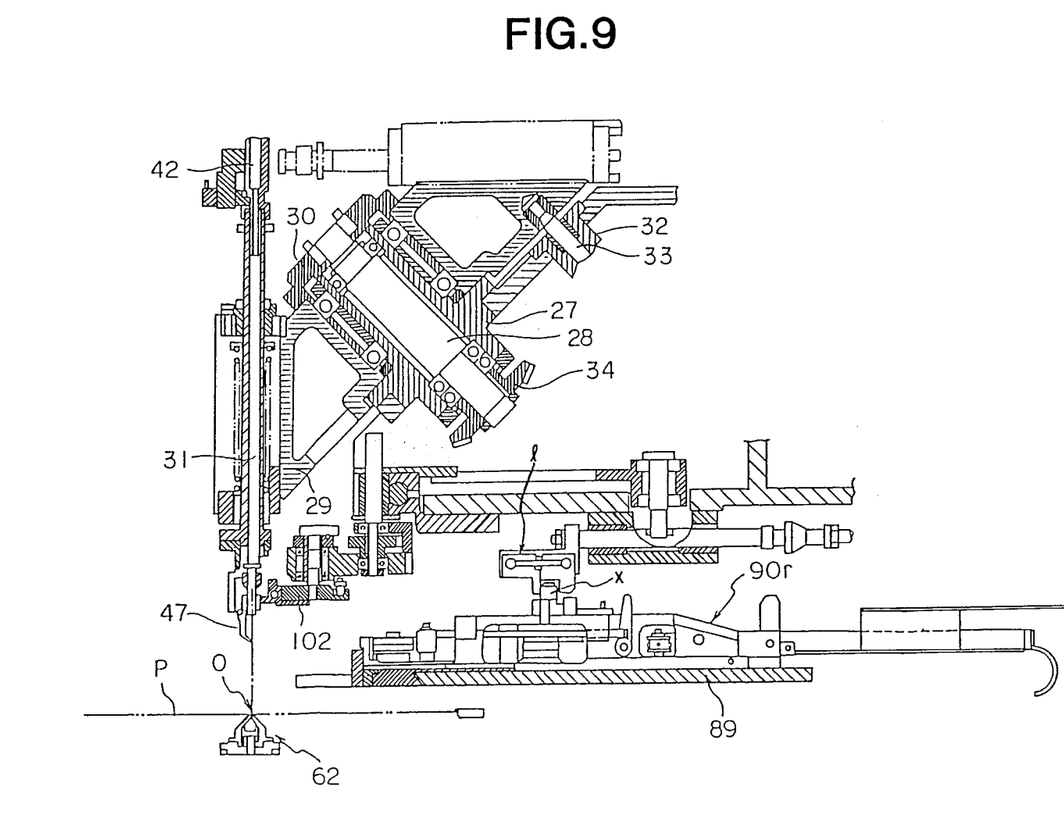
FIG. 9 is a side view of the taped radial component feeder.

In an insertion spindle column B as shown in FIGS. 3 and 9, above the XYΘ table A, a turret support 27 is inclined forwardly at 45° and mounted on the base frame 1. In the hollow portion of the turret support 27, a rotating shaft 28 is coaxially supported. By means of a fastener 30, the rotating shaft 28 is coupled to a turret head 29, and the turret head 29 is axially supported outside the turret support 27 and concentric with it, with respect to the rotating shaft 28.

The turret head 29 is formed in the shape of a regular pentagonal truncated pyramid. A straight line connecting a vertex (not shown) and a middle point of a base side meet at an angle of 45° with a perpendiuclar line from the vertex of the base (not shown). The rotary shaft 28 is provided so that the center line thereof falls in line with the perpendicular line. Furthermore, outside the turret head 29, a plurality of insertion spindles 31 are mounted so that an axis of a respective spindle is aligned with the straight line connected between the vertex and the middle point of the base side. These spindles 31 correspond to the types of electronic components to be inserted into the inserting-holes in the printed-circuit board P. A locating pin 33 slides within a support pipe 32 fixed to the turret support 27 and fits into a locating hole provided in the turret head 29. Thus the turret head 29 is located in a rotating position where one of the insertion spindles 31 is always perpendicular to the printed-circuit board P on the XYΘ table A. This location is engaged or disengaged by advancing or retracting the locating pin 33 by means of an air cylinder (not shown). The center line of the insertion spindle 31 located perpendicularly to the printed-circuit board is defined as a single fixed position 0, and the movement range of the XYΘ table A is determined so that any portion of the entire surface of the printed-circuit board P on the table A can be moved to the single fixed position 0.

To the rotating shaft 28 is fixed a bevel gear 34.

The bevel gear 34 is engaged with a bevel gear 35. The rotating shaft of the bevel gear 35 is rotated by a motor 36 via a reduction gear 37, toothed pulleys 38 and 39, toothed belts 40 and 41 to index the insertion spindle selected under numerical control to the single fixed position 0. The upper end of the insertion spindle 31 indexed to the single fixed position 0 is joined to a coaxial spindle operating rod 42. Cam followers 44a are in contact with rotating cams 45, and two levers 44 supported at a pivot shaft 43 on the base frame 1 are respectively rocked. This enables rings 46 engaged with the end of each of the levers 44 to couple the coaxial spindle operating rod 42 and depress it, thereby making an insertion head 47 perform a known lead inserting operation.

An air cylinder 113 (shown in FIG. 3) turns a jig 115 pivoted to the base frame 1 by a pin 114 and depresses the lever 44, thereby compensating for cutting and bending forces against the leads of the axial lead component. Reference numeral 116 is a rotary encoder which rotates in synchronism with the rotation of the cams 45 and generates necessary control signals.

(3) Clinch Turret C

Under the XYΘ table A, in a clinch turret C, a circular turret rest 51 is rotatably held by means of bearings 49 and 50 within a vertical support sleeve 48 fixed to the base frame 1, and to the lower portion of the circular turret rest 51, a toothed pulley 52 is fixed.

The toothed pulley 52 is rotatively indexed by the motor 36 via the reduction gear 37, toothed pulleys 38, 53, 54 and 55 and toothed belts 56, 57, 58 and others in synchronism with the insertion spindle turret head 29.

On the turret rest 51, known clinch spindles 59 equal in number to the insertion spindles 31 on the insertion spindle column B are vertically mounted at equal spaces.

The turret rest 51 is locked in position so that the axis of one of the clinch spindles 59 aligns to the single fixed position O. To this end, a locating pin 61 is guidedly held in a holding member 60, and when the pin 61 projects to engage with a locating hole in the turret rest 51, the turret rest 51 is locked in position.

On the upper end of each clinch spindle 59 is provided a clinch head 62 for clinching the leads of the electronic component inserted by the insertion head 47.

A roller 66 at the end of a lever 65 having a pivot shaft 64 is fit into a fork member 63 secured to the lower portion of the clinch spindle 59, and a cam follower 67 is attached to a lever 65a fixed to the pivot shaft 64.

Thus a cam 68 is in contact with cam follower 67 and rocks the lever 65, thereby making the clinch head 62 perform the clinching operation. The cam 68 and the cams 45 for driving the insertion head 47 are synchronously rotated by a motor 69 via a clutch brake 70, a reduction gear 71, a toothed pulley 72, the transmission mechanism including toothed belts 73, 74 and 75, and a further toothed belt 76. Thus the clinch head 62 is synchronized with the insertion head 47, and the above inserting and clinching operations are synchronously performed.

Figure 5:
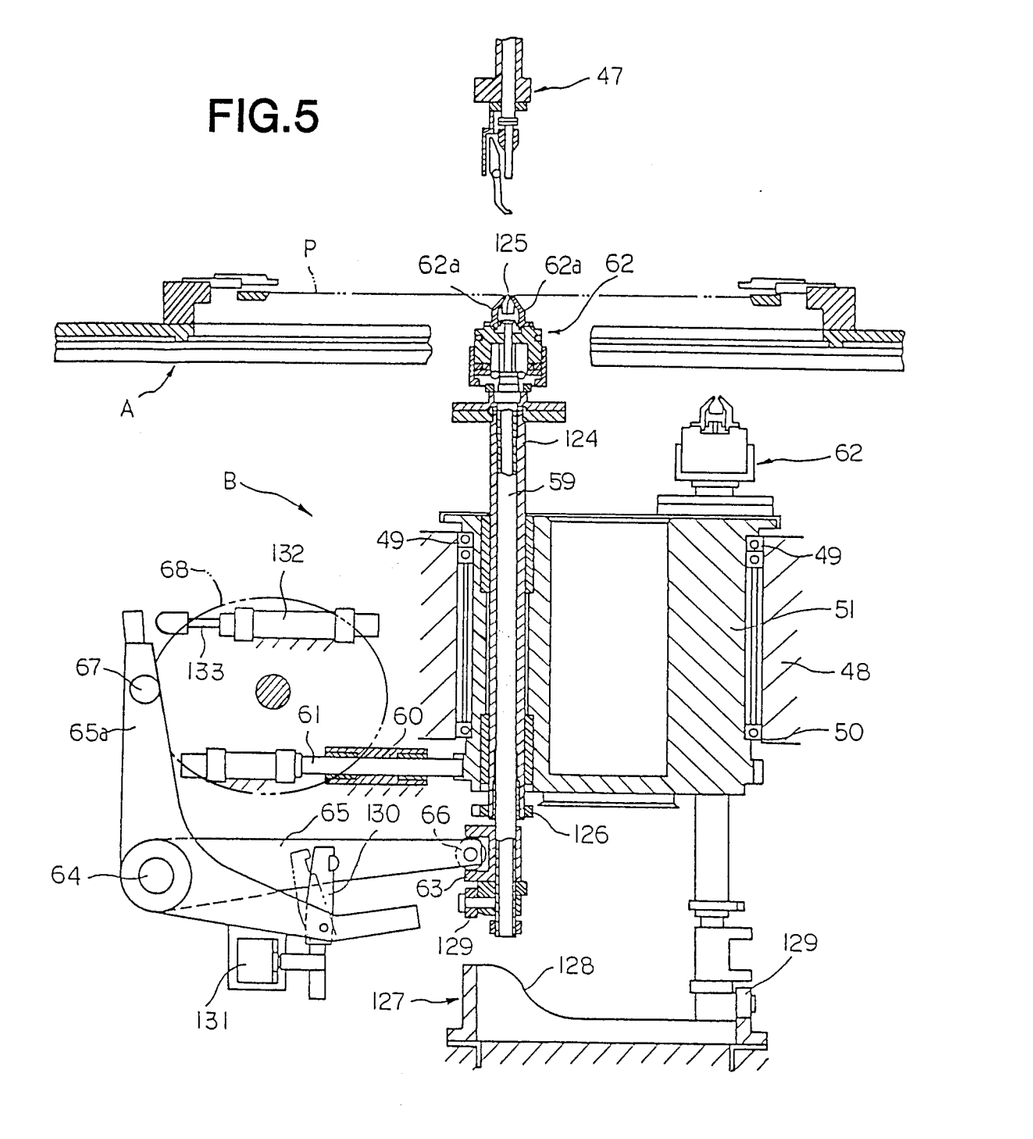
FIG. 5 is a detail view of a clinch turret.

FIG. 5 is a sectional view illustrating the details of the clinch turret C. The clinch spindle 59 for actuating the clinch head 62 is coaxially inserted in the hollow portion of an outer shaft 124. On the top of the outer shaft 124 is mounted the clinch head 62 for clinching the leads of the electronic component, and on the nose of the clinch spindle 59 is mounted an actuating piece 125 for opening and closing jaws 62a and 62a of the clinch head 62. This clinch head 62 is energized in the direction in which the jaws 62a and 62a are kept open.

When the clinch spindle 59 rises relative to the outer shaft 124, the jaws 62a and 62a of the clinch head 62 are depressed by the actuating piece 125 and closed so as to clinch the leads of the electronic component. As will be discussed later, this clinch head 62 is designed so that the clinch spindle 59 is directly driven axially and that the outer shaft 124 rises integrally with the clinch spindle 59 through a compression spring (not shown) between the clinch spindle 59 and the outer shaft 124.

For the rise of the clinch spindle 59 relative to the outer shaft 124, the clinch spindle 59 rises together with the outer shaft 124, a stop ring 126 fixed to the lower end of the outer shaft 124 contacts the lower end of the cylindrical turret rest 51, and the rise of the outer shaft 124 is blocked.

Under the cylindrical turret rest 51, a fixed cam 127 is provided. This fixed cam 127 is formed cylindrical in shape and provided with a cam profile 128 on its upper edge.

At the lower end of the clinch spindle 59 is mounted a cam follower 129 contacting the cam profile 128. This construction permits each clinch head 62 on the clinch spindle 59 to move axially, with the index rotation of the cylindrical turret rest 51; that is to say, the clinch head 62 moves axially so that at the single fixed position below the insertion head 47, the clinch head 62 can be placed in the upper position, while at the other positions, it can be placed in the lower position to such an extent that at least its nose does not interfere with the XYΘ table A.

Thus the clutch head 62 at the operating position is positioned in close vicinity to the printed-circuit board so as to minimize the up-and-down motion for the clinching operation, and the clinch heads 62 located except at the operating position are arranged so as not to interfere with the operations of the other relative devices.

The lever 65 is engaged with the fork member 63 secured to the lower portion of the clinch spindle 59 at the single fixed position and is driven by the lever 65a through a connecting member 130 to move the clinch head 62 in the axial direction. As clearly shown from the figure, as the cam 68 rises, levers 65a and 65 rotate counterclockwise to raise the clinch spindle 59 for clinching the leads. The connecting member 130 can be disengaged from the lever 65, if necessary, by driving an actuator 131. Therefore, for example, at the time of adjustment of the clinch head 62, the cam 68 can be disengaged from the lever and deenergized by the use of the actuator 131.

In the figure, 132 denotes an air cylinder for use as an auxiliary driving source. A piston rod 133 of this air cylinder 132 actuates to depress outwardly the end of the cam lever 65a on the side contacting the cam 68.

The depressing operation makes the cam lever 65a turn counterclockwise, and the turning of the cam lever 65a makes the lever 65 raise the clinch head 62 at the single fixed position for making the clinch head 62 clinch the leads. The air cylinder 132 is actuated by a manual signal of a pushbutton switch or the like, and therefore, the rise of the clinch spindle 59 can be singly performed.

Provision of this single-acting auxiliary driving source facilitates the correction of errors. For instance, should any incorrect operation such as an incorrect insertion take place, the electronic component automatic insertion machine comes to a stop in response to a signal from an error detecting device (not shown), and the operator removes that incorrect component and inserts a replacement. Then by a manual signal of a switch, or the like, the air cylinder 132 is actuated to perform the clinching operation. Thus the incorrect operation can be corrected instantaneously.

As a matter of course, the aforementioned auxiliary driving source is not limited to the air cylinder 132, but a known driving source such as a hydraulic cylinder or a solenoid can be applied widely.

(4) Taped Component Holding and Feeding Device D

Figure 4:
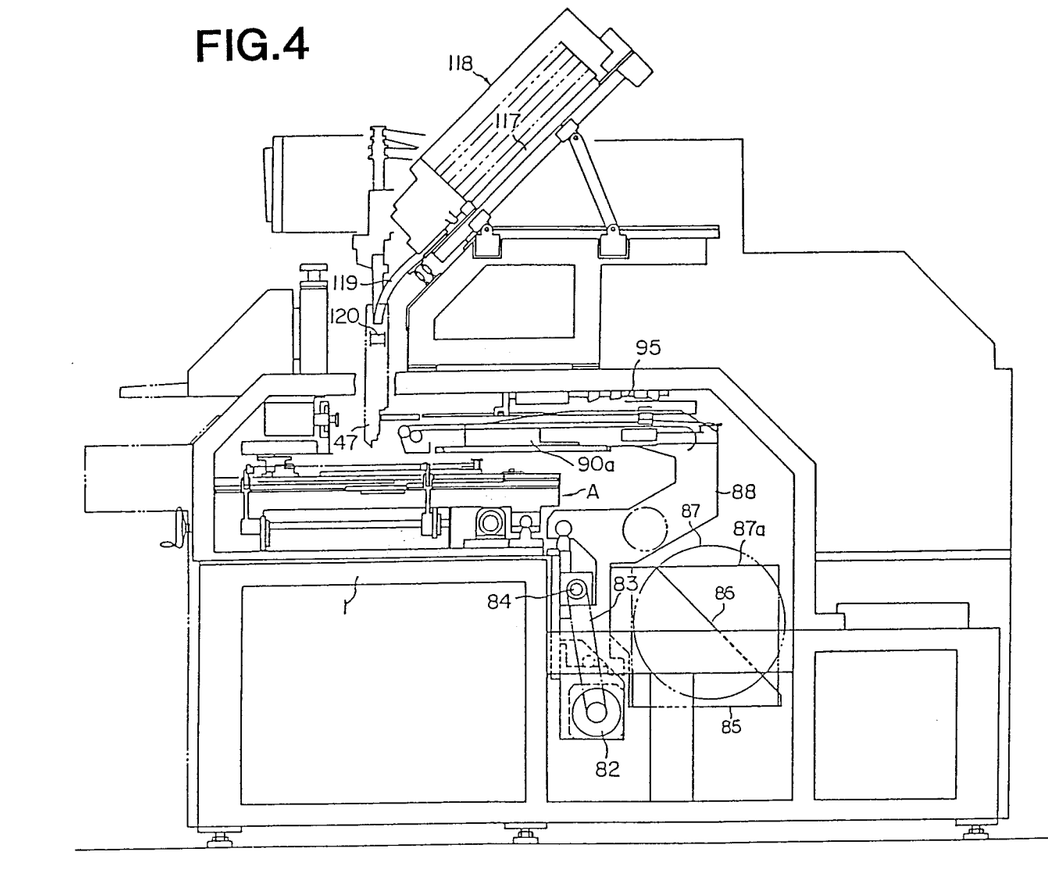
FIG. 4 is a left-side view showing a portion in a sectional view.

In order to feed selectively a variety of taped components into the insertion head 47, a taped component holding and feeding device D is provided behind the XYΘ table A. As shown in FIGS. 2 to 4, below and behind the XYΘ table A, an upper guide rail 78 and a lower guide rail 79 (FIG. 2 shows only the left half of each rail) extending in parallel with each other in the right and left direction are fixedly supported on the upper and lower portions of a support 77 (FIG. 3) secured to the base frame 1. A lateral frame 80 holds the upper guide rail 78 slidably, and a guide roller 81 supported on the lateral frame 80 is adapted to come into contact with both sides of the lower guide rail 79. Then, a numerically controlled servo motor 82 (FIG. 4) rotates a feed screw 84 via toothed belt 83. As a result, the lateral frame 80 is guidedly moved in the right and left direction.

To a holder 85 fixed to the lateral frame 80, many partitions 86 are attached. Reels 87 on which many taped electronic components are wound are removably arranged in a line; or cartons 87a (FIG. 4) holding the taped and folded electronic components are placed between the partitions 86, and they are mounted in the holder 85.

Figure 10:
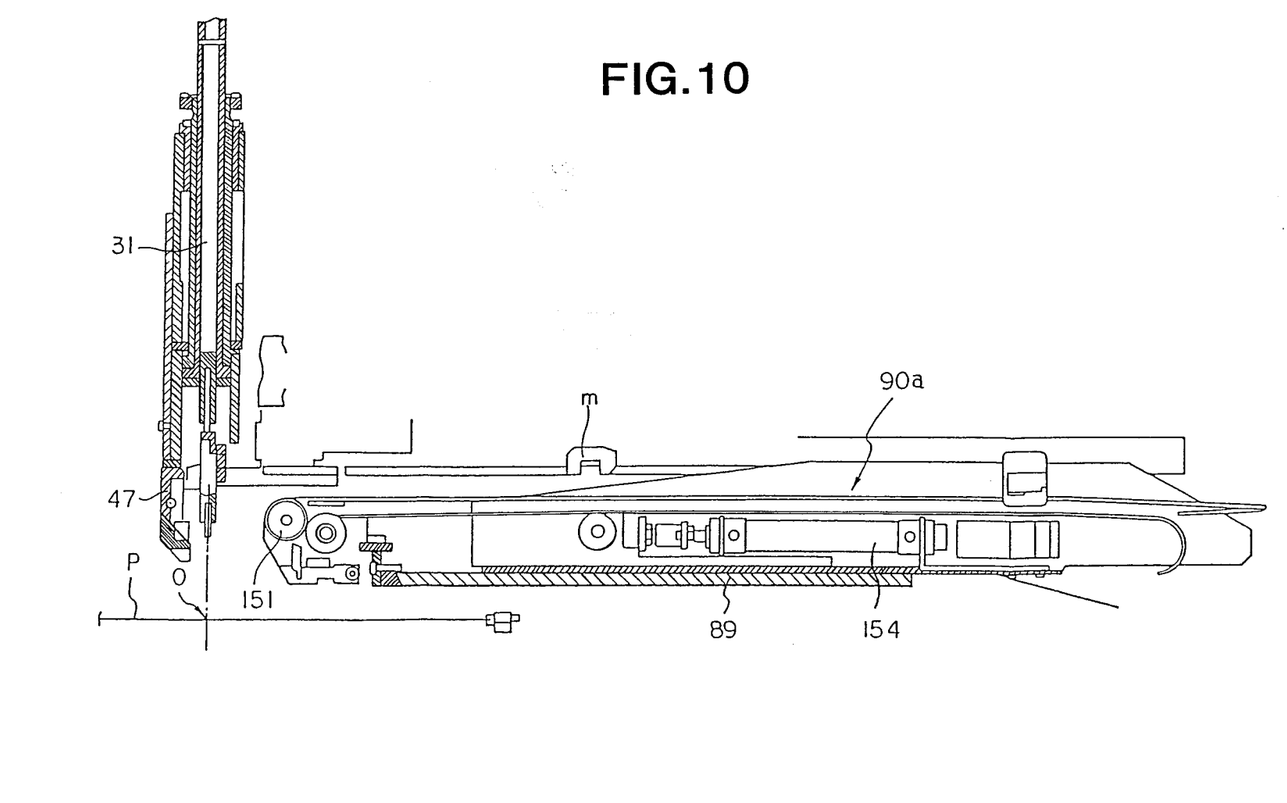
FIG. 10 is a side view of the taped axial component feeder.

To the lateral frame 80 is also secured a bent frame 88 which surrounds the fully rearward position of the Y frame 9 and extends forwards just above the printed-circuit board P on the XYΘ table A. On a mounting plate 89 fixedly secured to the lower surface of the bent frame 88, an axial lead component feeder 90a (FIGS. 4 and 10) and a radial lead component feeder 90r (FIGS. 3 and 9) are placed in a line in the right and left direction for each reel 87 or carton 87a. The axial and radial lead component feeders 90a and 90r are respectively designed to hold the taped electronic component taken out of each reel 87 or carton 87a, with the leads of the electronic component cut off, and to feed it to the insertion head 47.

The mounting plate 89 carrying the axial lead component feeder 90a and the radial lead component feeder 99r can be moved over the full right and left length in the base frame 1. When the taped component is selectively supplied, the mounting plate 89 is controlled to move according to the predetermined program so that the feeder 90a or 90r for the selected electronic component can be located behind the single fixed position O.

In this embodiment, the axial lead component feeder 90a is constructed so that axial lead electronic components can be fed in their flat position, that is, with each electronic component laid flat and the leads at both ends fixedly taped. On the other hand, the radial lead component feeder 90r is constructed so that radial lead electronic components can be fed in their vertical position, that is, with each electronic component standing and the lead down and fixedly taped. This eliminates the need for reorientation of components fed from each component feeder 90r and 90a when each of the axial lead electronic component or the radial lead component is inserted into the insertion holes in the printed-circuit board by means of the insertion head 47 having a different chuck corresponding to each of the axial lead electronic component and the radial lead electronic component to be inserted, and thus the insertion operation can be smoothly performed. As a result, as the outline is shown in FIG. 6, the axial lead component feeder 90a becomes wide, which width is determined by a space between tapes for fastening both sides of the leads, but the radial lead component feeder 90r can be narrowed since the taped component itself is also moved in a vertical position.

Figure 6:
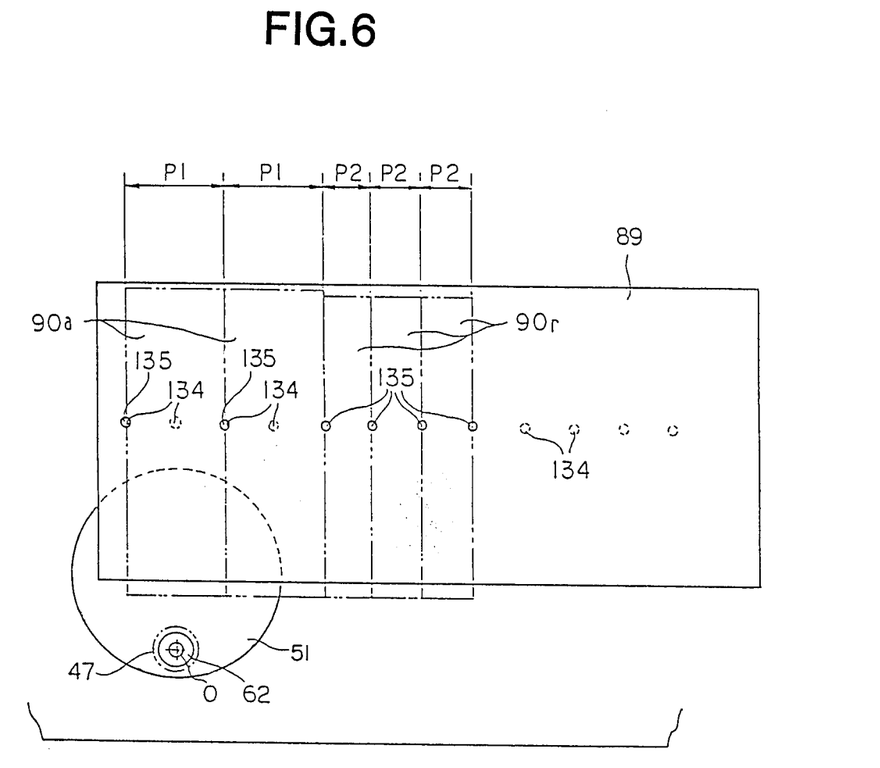
FIG. 6 is a schematic view showing the arrangement of taped electronic component feeders in a taped component holding and feeding device.

In the illustrated embodiment of FIG. 6, there are provided two wide axial lead component feeders 90a and several narrow radial lead component feeders 90r, wherein the width ratio of each component feeder is selected so that the mounting pitch $P_1$ of the wide axial lead component feeder 90a is an integer multiple, i.e. two times and three times, of the mounting pitch $P_2$ of the narrow radial lead component feeder 90r. The illustrated embodiment shows the relation of $P_1 = 2P_2$.

Each of the axial component feeder 90a and the radial component feeder 90r is designed so that the mounting pitch $P_1$ of $P_2$ can be positioned by locating pins 135 which are fit in pin holes 134. Accordingly, when from the circuit design conditions for the electronic components to be inserted into the printed-circuit board, it is required to insert various types of axial lead electronic components and it becomes necessary to prepare another axial lead component feeder 90a in addition to the two shown feeders, the two left-hand radial lead electronic component feeders 90r are removed, the center locating pins 135 are removed from the pin holes 134, and then another axial lead component feeder 90a is mounted.

In this way, the number of axial lead component feeders 90a can be seen increased.

On the other hand, when it is required to insert many types of radial lead electronic components and it becomes necessary to increase the number of the radial lead component feeders 90r, in contrast with the above, one axial lead component feeder 90a is removed, the locating pins 135 are placed into the center holes 134, and two radial lead component feeders 90r are mounted instead.

Figure 7A:
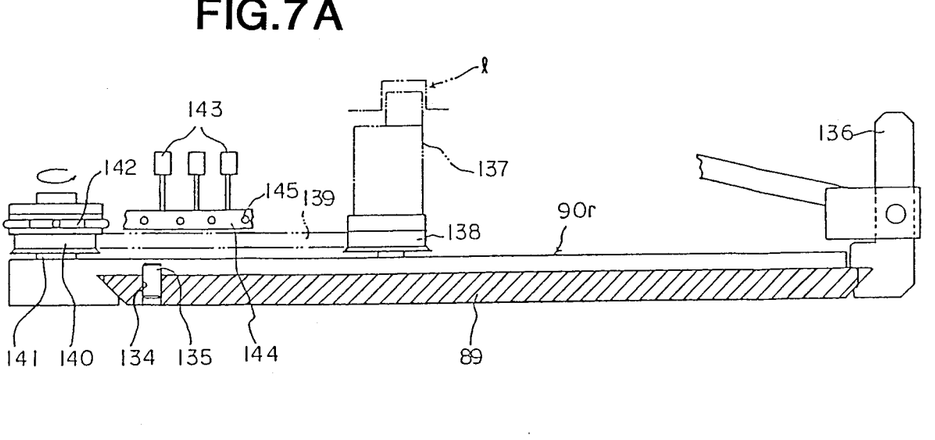
Figure 7B:
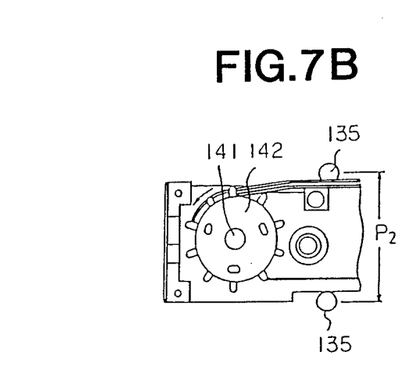

FIGS. 7 (A) and (B) are respectively a schematic side view of the radial lead component feeder 90r and a partial plan view of the end portion thereof. This radial lead component feeder 90r is formed as a removable device attached to the mounting plate 89 by means of a clamp 136 and is constructed as follows: An intermittent drive mechanism 137 comprising a known ratchet mechanism intermittently drives to rotate a toothed pulley 138. This operates, via a toothed belt 139, a shaft 141 of a toothed pulley 140, and a sprocket wheel 142 having feed pins attached to the shaft 141 rotates intermittently in the direction of the arrow. Then the feed pins of the sprocket wheel 142 are engaged with sprocket holes 145 in a tape 144 fastening radial lead electronic components 143 in the vertical position, and the radial lead electronic components 143 are intermittently fed in sequence to the end portion of the radial lead component feeder 90r. As will be mentioned hereinafter, the components are transferred from the end portion of the radial lead component feeder 190r to the insertion head 47 by an intermediate feeding device 102 (see FIG. 11).

As mentioned above, with the locating pins 135 fitted in the pin holes 134, locating is done in the lateral direction (perpendicular to the sheet of FIG. 7(A)) with respect to the mounting plate 89.

Figure 8:
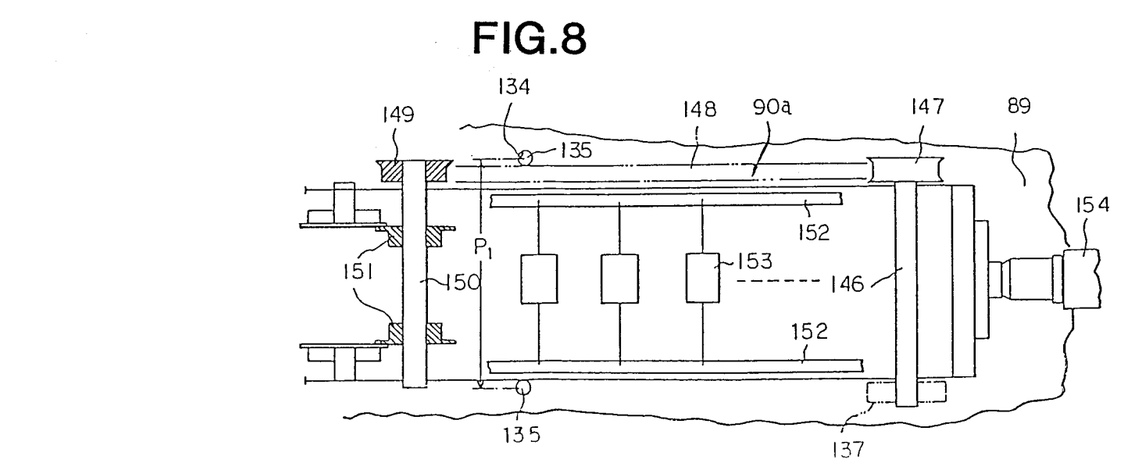
FIG. 8 is a plan view of a taped axial component feeder.

FIG. 8 is a schematic plan view of the axial component feeder 90a. Like the above radial lead component feeder 90r, this axial lead component feeder 90a is formed as a removable device attached to the mounting plate 89 by means of a clamp (not shown). The intermittent rotation of a toothed pulley 147 fixed to one end of a driving shaft 146 having an intermittent drive mechanism (not shown) comprising a ratchet mechanism is transmitted via a toothed belt 148 to a toothed pulley 149. A pair of right and left toothed wheels 151 are mounted on a shaft 150 of the toothed pulley 149 on the driven side. These wheels 151 are engaged with the leads of the axial lead electronic components 153 in the flat position attached to a pair of tapes 152 and 152 at a fixed pitch, and the axial lead electronic components 153 are intermittently fed in sequence to the end portion of the axial lead component feeder 90a. Then, a cylinder device 154 provided at the rear end of the axial lead component feeder 90a is actuated, whereby the topmost axial lead electronic component 153 advances together with the axial lead component feeder 90a and is carried to the single fixed position 0 just below the insertion head 47, and at the position, the leads are cut off, and the axial lead electronic component 153 is held in the insertion head 47. Also in this case, the locating pins 135 are securely inserted in the pin holes 134 in the mounting plate 89. As already mentioned, the locating pins 135 settle the lateral position of the mounting plate 89.

As a driving source of the axial lead and radial lead component feeders 90a and 90r for feeding taped components, in FIG. 3, there are provided rotating cams 91a and 91r coaxial with the cams 45, two levers 93 (only one is shown in FIG. 3) rocked around a pivot shaft 92 by both cams 91a and 91r, and the feed lever 94. The feed lever 94 is engaged with one of the two levers 93 selectively by means of an engaging and disengaging device by a control signal in accordance with whether the electronic component being selectively fed to the insertion head 47 is an axial lead component or a radial lead component, and the feed lever 94 is rocked. However, when the electronic components being selectively fed are ICs packed in a stick, as will be discussed later, the feed lever 94 is engaged with none of the levers 93.

The feed lever 94 is connected at its end to a tape feed drive shaft 95, and when the feed lever 94 is engaged with one of the two levers 93 as mentioned above, the lever 94 advances the shaft 95, which in turn advances one taped electronic component stopped just below. For example, when that electronic component is an axial lead component, the feeder 90a advances and feeds it to the insertion head 47.

Figures 11A, 11B:
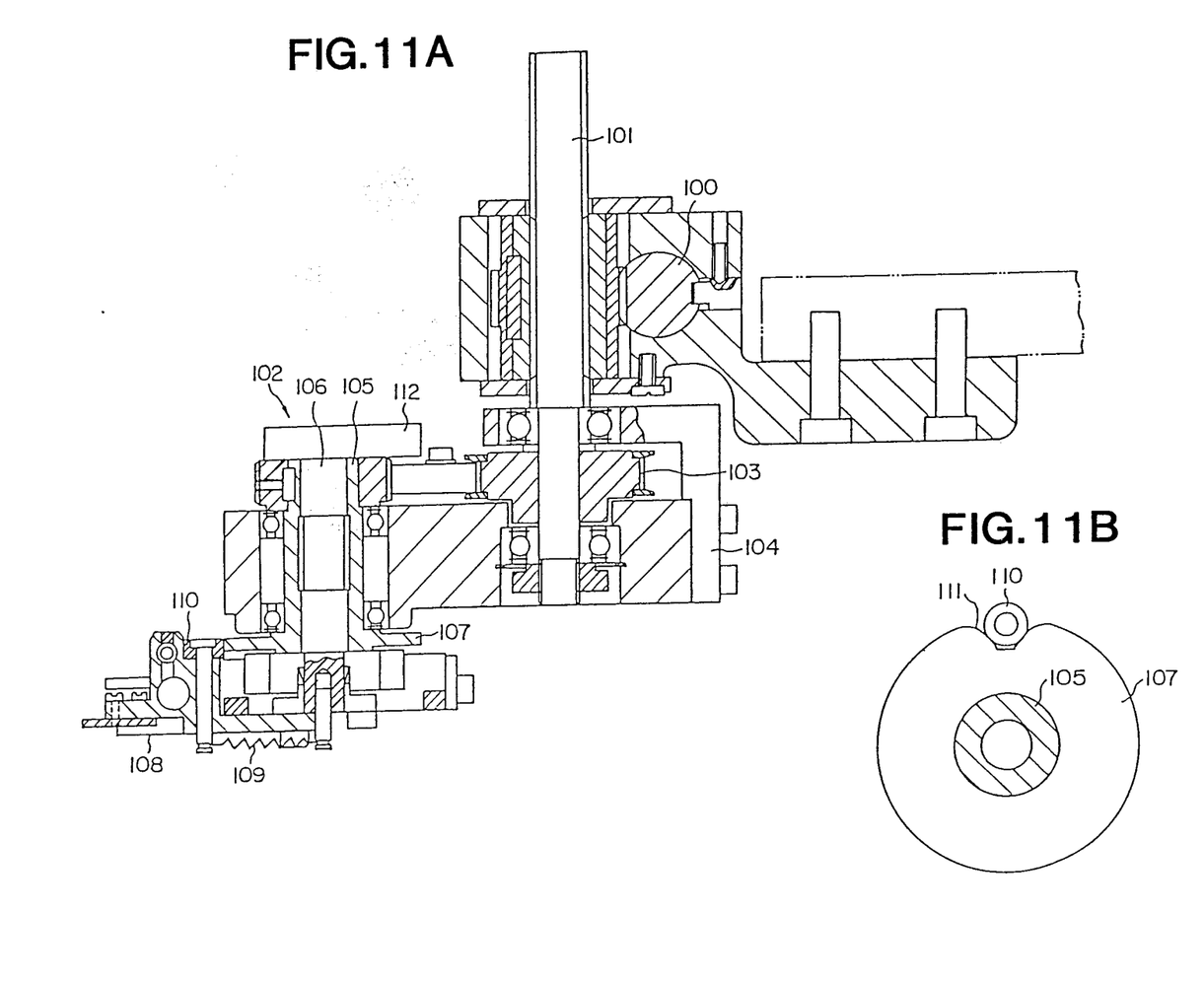

Furthermore, there is provided a rotating cam 96 (FIG. 2) coaxial with the cams 45. A cam follower 97a, in FIG. 3, touches this cam 96 to rock a lever 97 ON the pivot shaft 92. The lower extending portion of the lever 97 overlaps in the drawing with the lower extending portion of the lever 94, and its lower end is connected through a lever 95 and a connecting rod (not shown) to one end of a hooked lever 99 (see FIG. 2) which can be rotated about a fixed pin 98. When the rocking of the lever 97 rotates the lever 99, the other end of the lever 99 makes a rack 100 slide perpendicularly to the sheet of FIG. 3 (refer to FIG. 11 (A)). This rotates a spline shaft 101.

The spline shaft 101 supports an intermediate feeding device 102 (FIG. 11) for receiving a radial lead component from the radial lead feeder 90r and supplying it to the insertion head 47. In FIG. 11 (A), the spline shaft 101 moves up and down by an air cylinder (not shown). The lower portion of the shaft 101 is provided with a toothed pulley 103 which moves up and down, and rotates with the shaft 101. The lower portion of the shaft 101 is also provided with a frame 104 which moves up and down with the shaft 101, but is prevented from rotating by a well-known means (not shown). The frame 104 is provided with a cam shaft 105 belt-driven from the toothed pulley 103 and a concentric intermediate shaft 106 inside the cam shaft 105.

The cam shaft 105 is provided with a unitary cam plate 107 shown in FIG. 11 (B). The intermediate shaft 106 supports a chucking member 108 which is guidedly slidable perpendicularly to the shaft 106. The chucking member 108 is attracted by a spring 109 towards the intermediate shaft 106. Thus a roller 110 journalled on the chucking member 108 is normally fit into a recess 111 provided in the cam plate 107. Under this condition, the cam shaft 105 rotates the intermediate shaft 106 and they rotate together. However, when the cam shaft 105 rotates to the position in which the chucking member 108 is opposite to the radial lead component feeder 90r or the insertion head 47, the intermediate shaft 106 is stopped rotating as a stop member 112 hits a stop (not shown). Next, when the cam shaft 105 further rotates about 20°, the roller 110 is pushed out of the recess 111 and advances the chucking member 108. In such a way the electronic components are supplied to the insertion head 47.

When an axial lead component is being inserted, the intermediate feeding device 102 is retracted to the upper position shown in a solid line of FIG. 3 so as not to prevent the advancement of the axial lead component feeder 90a. However, when a radial lead component is being inserted, the intermediate feeding device 102 lowers to the position shown in a dot and dash line of FIG. 3, the chucking member 108 rotates 180° and receives the radial lead component from the radial lead component feeder 90r, and then, the chucking member 108 reverses 180° and feeds the radial lead component to the insertion head 47. After that, the intermediate feeding device 102 rises.

The spline shaft 101 rises and falls according to a program for selectively feeding radial lead components, and the timing of the rotation of the spline shaft 101 and the timing of the operation of the chucking member 108 are governed by the cam 96.

(5) Stick Component Holding and Feeding Device E

As shown in FIGS. 1 and 4 on the right and left sides of the insertion spindle column B are provided stick holding racks 118 in which many columns of sticks 117 in the right and left directions are closely arranged. Each stick 117 arranges and holds DIPS ICs classified by type. Each column of the holding rack 118 is also capable of holding a plurality of sticks in the vertical direction, that is, piling many sticks in layers. From the lower end of each stick 117, (when many sticks are piled in layers, from the lower end of the stick at the lowest portion) a DIP is taken, one by one, is put in a direction through the guide tube 119, and is supplied onto a belt conveyor 120.

The aforementioned XYΘ table A, taped component holding and feeding device D, and stick component holding and feeding devices E are wholly controlled by an NC unit provided within the base frame 1. The NC unit comprises two sections: a fixed sequence control section for carrying the printed-circuit board onto the XYΘ table A, positioning the board in the table A and carrying the board out of the table A; and a variable program control section for selecting the holding and feeding device D or E to be used, selecting the insertion spindle and clinch spindle according to the type of an electronic component to be inserted, moving the printed circuit board P with respect to the selected electronic component, to the single fixed position P.

The printed-circuit board P is fed from the conveyor 17 onto the XYΘ table A, and locked in position. Electronic components to be inserted from the holding and feeding device D or E to the printed-circuit board P are taken out one by one in accordance with the predetermined sequence. The spindle column B and the clinch turret C are rotatively indexed by the motor 36 so that the insertion spindle 31 and the clinch spindle 56 are located in the single fixed position O, and the electronic components taken out are supplied to the insertion head 47. On the other hand, the XYΘ table A traverses the printed-circuit board P to the position in which the electronic component insertion portion aligns to the single fixed position O. Then the rotations of cams 45 and 68 permit the insertion head 47 and the clinch head 62 to cooperate with each other, thereby inserting the above electronic component.

At the intermediate time of each inserting operation of the electronic component, the rotating cams 45 and 68 are stopped rotating by the clutch brake 70. When all the inserting operations have been completed, the releasing means 23 depresses a release lever 23a fixed to the rod 21 at the traversed end of the XYΘ table A to release the locating pin of the printed-circuit board P.

The printed-circuit board P is taken out by the drawing hook 25 and carried out along the conveyor 26.

Although in the aforementioned embodiment, cams 45 and 68 are mechanically synchronized to rotate, it is easy to synchronize them electrically to rotate.

INDUSTRIALLY APPLICABLE POSSIBILITIES

The present invention is of the aforementioned construction and has the following marked effects:

(1) Since the insertion spindle and the clinch spindle perform the inserting operation of a predetermined electronic component fed from the feeding device, in a position of the printed-circuit board which has reached to the single fixed position opposed to the above spindles, a variety of electronic components can be inserted while the printed-circuit board is traversed sequentially from its end, and the traverse amount of the printed-circuit board is minimized as possible, thereby increasing the efficiency of the inserting operation and minimizing the size of the printed-circuit board traverse device.

(2) Since a plurality of insertion spindles and clinch spindles suitable for inserting various electronic components are replaceably equipped and concentrated in the single fixed position and they are selectively actuated, there provides sufficient space for electronic component feeding devices around the single fixed position, and this is very convenient for inserting many types of electronic components.

We claim:

1. An automatic insertion machine for electronic components comprising:
   a printed-circuit board traverse device for supporting a printed-circuit board and traversing it so that an inserting hole in the printed-circuit board for inserting a lead of an electronic component is placed in a single fixed position;
   an insertion spindle column, which is located above the traverse device, comprising a plurality of insertion spindles each having a different insertion chuck, and indexes one of the plurality of insertion spindles which correspond to a selected electronic component to the single fixed position;
   a taped component holding and feeding device having a plurality of taped electronic component feeders arranged for holding many taped electronic components and feeding them sequentially to one of the plurality of insertion spindles, one of the taped component feeders being optionally selected and indexed to the vicinity of a single fixed position, the taped component holding and feeding device feeding the optionally selected electronic component to one of the plurality of insertion spindles indexed to the single fixed position; and
   a stick-packed component holding and feeding device which is located above the taped component holding and feeding device, comprising a stick holding rack for holding many sticks each containing many electronic components, takes an electronic component out of one of the sticks selected optionally and feeds the taken electronic component through a conveyor to one of the insertion spindles indexed to the single fixed position.

2. The automatic insertion machine for electronic components according to claim 1, wherein the stick-packed component holding and feeding device is provided, with a top of the device kept inclined backward toward the machine, on the right and left sides of the insertion spindle column.

3. An automatic insertion machine for electronic components comprising:
   a printed-circuit board traverse device for supporting a printed-circuit board and traversing it so that an inserting hole in a printed-circuit board for inserting a lead of an electronic component is placed in the single fixed position;
   a turret-like insertion spindle column located above the traverse device for holding a plurality of insertion spindles each having a different insertion chuck and indexing rotatively a desired insertion spindle to the single fixed position in accordance with a selected electronic component; and
   a taped component holding and feeding device including a plurality of taped electronic component feeders located below and behind the insertion spindle column and arranged on a mounting plate movable left and right, each of the taped electronic component feeders capable of holding many taped electronic components, being optionally selected, indexed to a fixed position corresponding to the single fixed position, and supplying the electronic components to the indexed insertion spindle.

4. The automatic insertion machine for electronic components according to claim 3 wherein the taped electronic component feeders comprise an axial lead component feeder for supplying taped axial lead components and a radial lead component feeder for supplying taped radial lead components, a plurality of the axial and radial lead component feeders being arranged on mounting positions predetermined by locating pins on the mounting plate, in which the mounting width of the axial lead component feeder is an integer multiple of the mounting width of the radial lead component feeder.

5. The automatic insertion machine for electronic components according to claim 4 wherein the locating pins are removably provided in the mounting plate.

6. The automatic insertion machine for electronic components according to claim 3 wherein the taped component holding and feeding device includes a mounting plate provided movably in the lateral direction with respect to the insertion spindle; an axial lead component feeder and a radial lead component feeder arranged on the mounting plate, and further comprises only one driving mechanism provided at a fixed position above the mounting plate, the only one driving mechanism being engageable with each follower of a carrying mechanism for the axial lead component feeder or the radial lead component feeder located in a predetermined position in the near vicinity to the single fixed position by the lateral movement of the mounting plate; and a driving source for driving the only one driving mechanism relative to the driving of the insertion head.

7. The automatic insertion machine for electronic components according to claim 6 wherein the driving mechanism includes two cams, two cam levers and one feed lever for being connected with one of the cam levers and wherein each follower comprises a transmission lever of an intermittent feed mechanism provided in each carrying mechanism of both the feeders.

8. An automatic insertion machine for electronic components comprising:
   a printed-circuit board traverse device for supporting a printed-circuit board and traversing it so that an insertion hole is the printed-circuit board for inserting a lead of a selected electronic component is placed in a single fixed position;

a turret-like insertion spindle column located above the traverse device for holding a plurality of insertion spindles each having a different insertion chuck and indexing relatively a desired insertion spindle to the single fixed position in accordance with the selected electronic component;

a clinch turret located below the printed-circuit board traverse device for holding a plurality of clinch spindles cooperating with the insertion spindles and for indexing a clinch spindle corresponding to the insertion spindle indexed rotatively to the single fixed position.

9. The automatic insertion machine for electronic components according to claim 8, wherein the clinch turret is provided with an auxiliary power source for operating said clinch turret so said clinch turret can perform a manual clinching operation.

10. The automatic insertion machine for electronic components according to claim 8, wherein the clinch turret comprises:

a turret rest indexing rotatively for holding a plurality of clinch spindles;

a turret driving device for indexing rotatively the clinch spindle corresponding to the insertion spindle which is selected in accordance with the electronic component and placed in the inserting position so that the clinch spindle may be concentrical with respect to the insertion spindle; and a clinch spindle up-and-down driving mechanism for driving only the clinch spindle located in the single fixed position on the up-and-down direction.

11. An automatic insertion machine for electronic components comprising:

a printed-circuit board traverse device for supporting a printed-circuit board and traversing it so that an inserting hole in the printed-circuit board for inserting a lead of an electronic component is placed in a single fixed position;

an insertion spindle column which is located above the traverse device, comprising a plurality of insertion spindles each having a different insertion chuck, and indexes one of the plurality of insertion spindles which correspond to a selected electronic component, to the single fixed position;

a component feeding device for feeding an optionally selected electronic component to one of the plurality of insertion spindles indexed to the single fixed position;

wherein said insertion spindle column comprises:

a turret head having an insertion spindle column having an insertion spindle mounting surface;

a plurality of insertion spindles mounted on the mounting surfaces of the turret head and each having a different chuck to be used for a different component;

a turret driving and locating mechanism for indexing rotatively one selected insertion spindle to the single fixed position; and an insertion head driving mechanism for driving the insertion spindle up and down.

* * * * *